(12) United States Patent
Kanjanavikat (10) Patent No.: US 6,609,701 B1
(45) Date of Patent: Aug. 26, 2003

(54) DEVICES AND METHODS FOR INTEGRATED CIRCUIT CONTAINER RELEASE

(75) Inventor: Adisorn Kanjanavikat, Bangkok (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/689,403

(22) Filed: Oct. 12, 2000

(51) Int. Cl.[7] .................................................. B66F 3/00
(52) U.S. Cl. ........................... 254/131; 29/762; 29/270; 29/426.5; 29/283; 29/764
(58) Field of Search ....................... 29/762, 270, 426.5, 29/283, 764, 203, 268, 275, 280, 741; 145/46; 254/131

(56) References Cited

U.S. PATENT DOCUMENTS

| | | | |
|---|---|---|---|
| 4,207,665 A | | 6/1980 | Kurek |
| 4,295,258 A | | 10/1981 | Penn et al. |
| 4,373,258 A | * | 2/1983 | Hutchins ..................... 29/764 |
| 4,424,625 A | * | 1/1984 | Callahan ..................... 29/764 |
| 4,533,043 A | | 8/1985 | Swain |
| 4,620,366 A | | 11/1986 | Koon |
| 4,817,273 A | * | 4/1989 | Lape ........................... 29/741 |
| 5,360,092 A | * | 11/1994 | Sachschale ................. 193/2 R |
| 5,896,607 A | * | 4/1999 | Hagen ............................ 7/166 |
| 6,076,435 A | | 6/2000 | White, Sr. et al. |
| 6,409,152 B1 | * | 6/2002 | Bagley ........................ 254/18 |

FOREIGN PATENT DOCUMENTS

GB           171335     * 11/1921  ..................... 7/166

* cited by examiner

*Primary Examiner*—Joseph J. Hail, III
*Assistant Examiner*—Daniel Shanley
(74) *Attorney, Agent, or Firm*—Eschweiler & Associates, LLC (57) ABSTRACT

Devices and methods for releasing an integrated circuit from its container are provided. The devices include a handle portion and a gripping portion. The gripping portion has one or more notches that are used to engage an integrated circuit container pin. In one aspect, the gripping portion is used to engage the container pin, and downward pressure is applied to the handle portion to remove the pin. In another aspect, the gripping portion is used to engage the container pin, and the handle portion is twisted to remove the pin.

14 Claims, 10 Drawing Sheets

DEVICES AND METHODS FOR INTEGRATED CIRCUIT CONTAINER RELEASE

The present invention relates generally to integrated circuit storage, and more particularly to devices and methods for releasing an integrated circuit from a storage container.

BACKGROUND OF THE INVENTION

Figure 1:
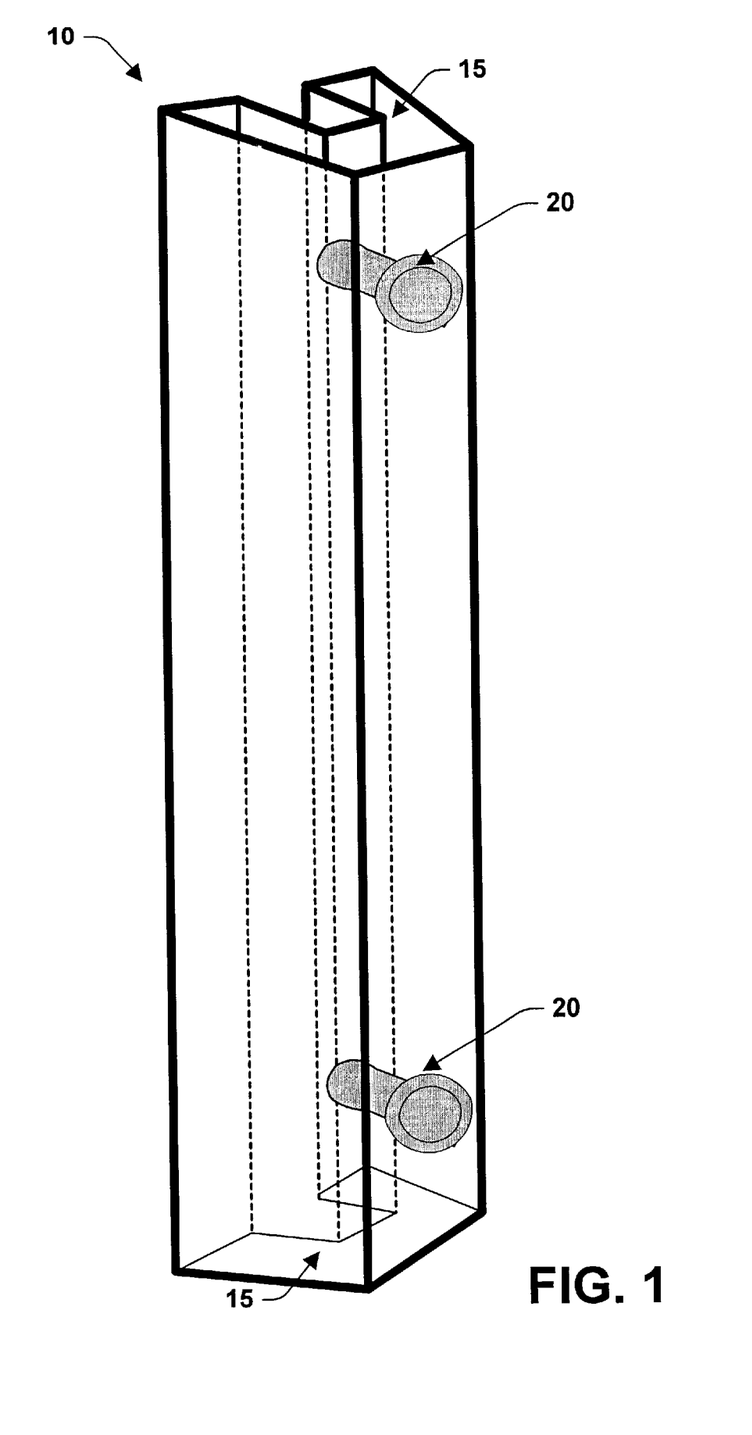
FIG. 1 is a schematic illustration of a hollow tube for storing ICs.
Figure 2:
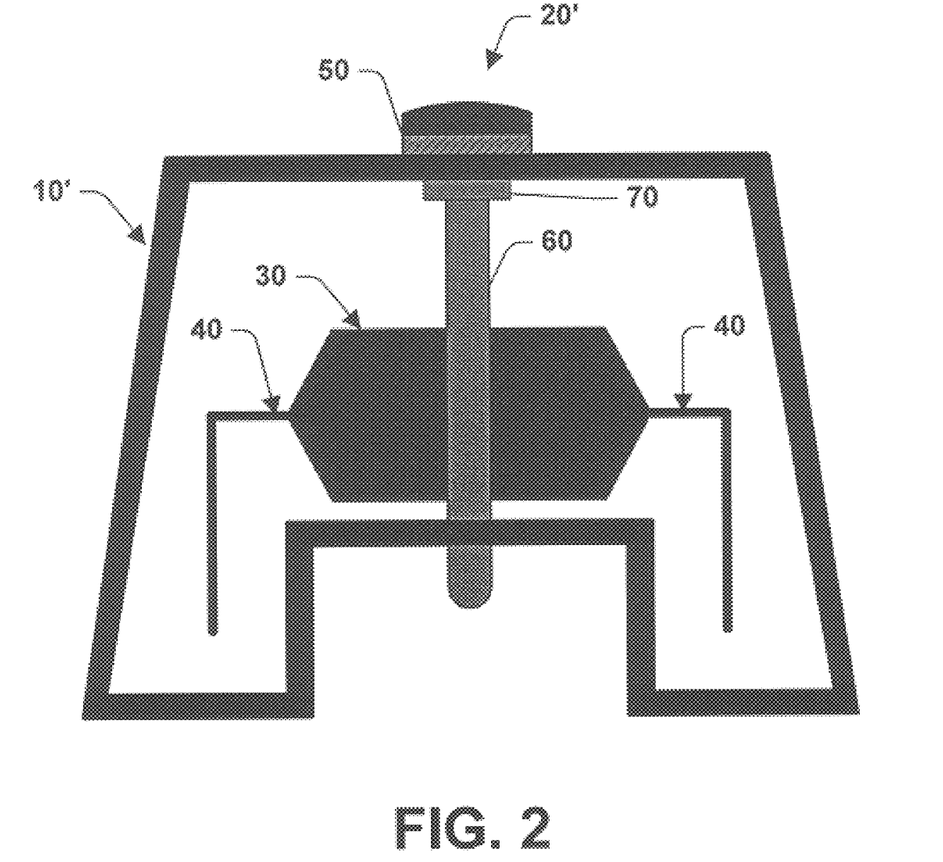
FIG. 2 is a schematic illustration of an IC retained inside of a container with a retaining pin.

Integrated circuits (ICs) can be damaged during storage and transport by static charges and by mechanical forces. To avoid such damage, ICs are often stored in hollow tubular thermoplastic containers. An exemplary tube 10 for a DIP-type package is shown in FIG. 1. The tubes 10 are open on both ends 15, and the ICs (not shown) are retained in the tube 10 by plastic or other type retainer pins 20 that are inserted into holes in the ends of the tubes 10. The integrated circuit packages 30 sit in the base of the tube and the leads 40 sit in the channels of the tube, for example, as shown in FIG. 2. The pins 20' generally consists of a cap 50 and a shaft 60 made of a hard material, such as plastic. The pins 20' have enlarged shoulders 70 under their caps 50 to snap fit into the openings so that they remain in place.

To remove the ICs from the container, one or more of the pins is pulled out, and the tube is tilted to allow the ICs to slide out of the open end. Removing the pin from the hole in the tube to release the IC can be difficult. Typically, to remove the pin, plyers, tweezers and the like are used. The cap of the pin can also be cut off to facilitate removal. These techniques of pin removal are time consuming, inconvenient, and can damage the integrated circuits in the tubes. Thus, the current systems and methods of releasing ICs from their containers are difficult, inefficient, and prone to damaging the IC. A simple device that will quickly release the pin and that will not damage the ICs inside is needed.

SUMMARY OF THE INVENTION

The present invention includes devices and methods useful for releasing an IC from a container. One aspect of the present invention includes a notched device for removing retaining pins from IC containers. The notched portion of the device is used to engage the shaft of the retaining pin. Force is then applied to a handle of the device to remove the pin. The force may be a downward force or a twisting force. The force applied to the handle is transferred to the notched portion, which results in extraction of the pin from the container.

The present invention has several advantages over the prior art. For instance, the present invention greatly reduces the likelihood of damage to the tubes and the ICs. The prior art devices and methods risk damaging the tube by utilizing tools that are not specially adapted to fit the retaining pin. These prior art tools and methods remove the pins by grasping the retaining pin by the cap or the shaft and pulling to remove it. The amount of force necessary to pull the enlarged shoulder of the pin out of the hole in the container can result in cracking the tube, or if enough force is applied, damaging the ICs. By utilizing a tool with a gripping portion adapted to accommodate the shaft of the retaining pin and a handle that provides leverage, the amount of force used to remove the pin is reduced. Thus the risk of damage to the tube and ICs is reduced.

The present invention also reduces the amount of time and labor involved in removing the pins. For instance, the prior art includes snipping off the cap of the pin and then agitating the container to remove the shaft of the pin. Utilizing this method can cause the shaft of the pin to become lodged in the tube, and it may be difficult to dislodge. The present invention eliminates the need to disassociate the cap and the shaft of the pin. Pin removal is accomplished in a quick and easy manner by engaging the shaft of the pin with a notched device and applying force. Thus, the systems and methods of the present invention improve the speed, accuracy, and simplicity of pin removal, and overcome the limitations and shortcomings of the prior art.

In accordance with one aspect of the present invention a device for releasing an integrated circuit from a container is provided. The device includes a gripping portion and a handle portion. The handle portion is attached to or may be integrated with the gripping portion. The gripping portion has one or more notches associated therewith. The handle portion may include a bent portion. The gripping portion may include at least two teeth positioned substantially parallel to each other forming the one or more notches therebetween. The gripping portion may be positioned substantially perpendicular to the handle portion. The two teeth also may be substantially rectangular in shape. The gripping portion may include at least two teeth positioned substantially obliquely to each other forming the one or more notches therebetween. The one or more notches may be substantially U-shaped or substantially V-shaped. At least one of the one or more notches may substantially accommodate an integrated circuit tube pin associated with an integrated circuit tube such as an SOIC 44 package tube. The handle portion may comprise a rigid bar with a bend at about two-third's along its length.

In another aspect of the present invention a method of releasing an integrated circuit from a container is provided. The method may include gripping an integrated circuit container pin with a notched device, and applying generally downward pressure on a handle portion thereof. The notched device may have a handle portion and a gripping portion. The handle portion may be attached to the gripping portion. The gripping portion may have one or more notches. The handle portion of the notched device includes a bent portion. The gripping portion of the notched device may include at least two teeth positioned substantially parallel to each other forming the one or more notches therebetween. The gripping portion may be positioned substantially perpendicular to the handle portion. The gripping portion of the notched device may include at least two teeth positioned obliquely to each other forming the one or more notches therebetween. At least one of the one or more notches may be substantially U-shaped or substantially V-shaped. The handle portion of the notched device may comprise a rigid bar with a bend at about two-third's along its length. The application of a generally downward pressure on the handle portion causes the notched device to tilt about a pivot point, generating mechanical advantage about a mechanical moment which is a function of the handle portion and gripping portion, respectively.

In yet another aspect of the present invention a method of releasing an integrated circuit from a container is provided. The method includes gripping an integrated circuit container pin with a notched device, and twisting the handle portion with respect to or away from the container. The notched device may have a handle portion and a gripping portion. The handle portion may be attached to the gripping portion. The gripping portion may have one or more notches. The handle portion of the notched device may include a bent portion. The gripping portion of the notched device may include at least two teeth positioned substantially parallel to each other forming the one or more notches therebetween. The gripping portion may be positioned substantially perpendicular to the handle portion. The gripping portion of the notched device may include at least two teeth positioned obliquely to each other forming the one or more notches therebetween. At least one of the one or more notches of the notched device may be substantially U-shaped or substantially V-shaped. The handle portion of the notched device may comprise a rigid bar with a bend at about two-third's along its length.

To the accomplishment of the foregoing and related ends, the invention comprises the features hereinafter fully described and particularly pointed out in the claims. The following description and the annexed drawings set forth in detail certain aspects and embodiments of the invention. These aspects and embodiments are indicative, however, of but a few of the various ways in which the principles of the invention may be employed. Other objects, advantages, and novel features of the invention will become apparent from the following detailed description of the invention when considered in conjunction with the drawings.

DETAILED DESCRIPTION OF THE INVENTION

The following is a detailed description of the present invention made in conjunction with the attached figures, wherein like reference numerals will refer to like elements throughout. The invention provides devices and methods capable of releasing an IC from a container.

Figures 3A, 3B, 3C:
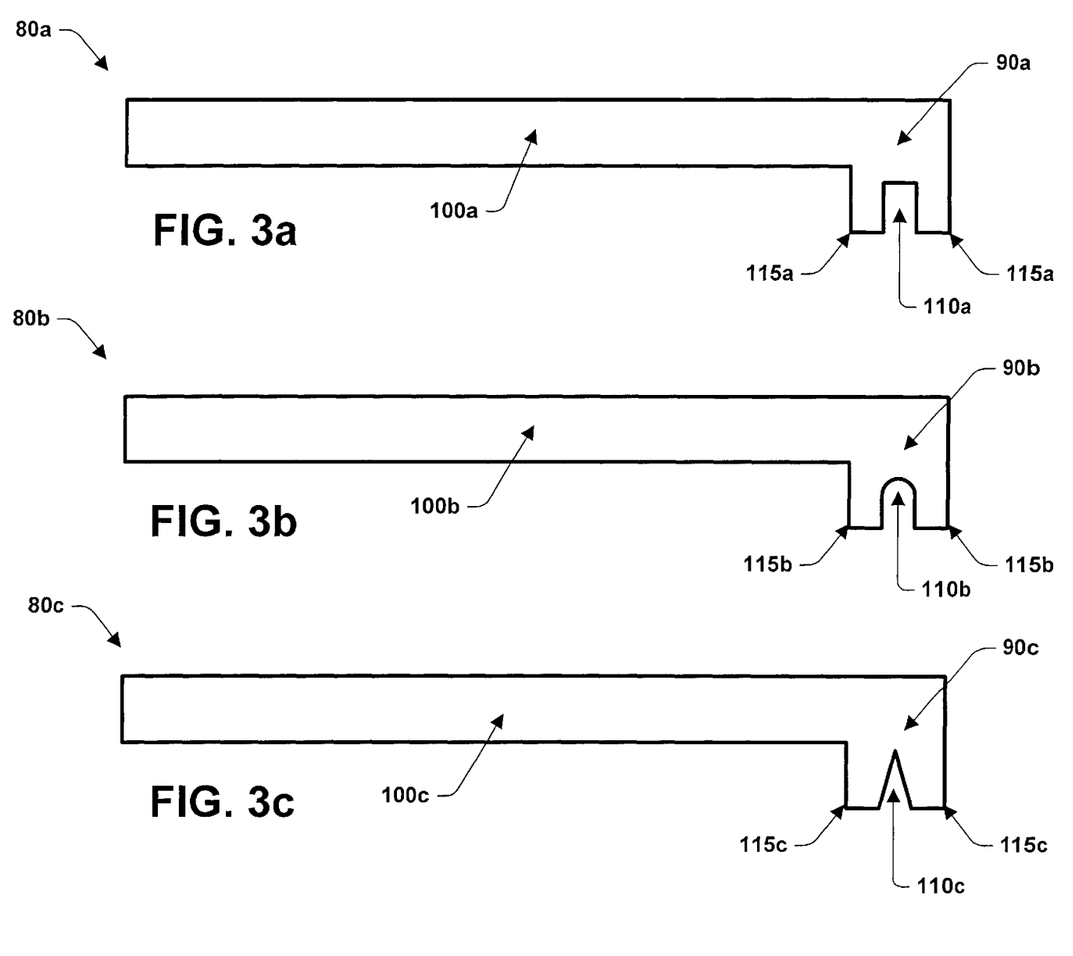
FIG. 3a is a schematic illustration of a device for removing an IC from a container in accordance with one aspect of the present invention.
FIG. 3b is a schematic illustration of a device for removing an IC from a container in accordance with one aspect of the present invention.
FIG. 3c is a schematic illustration of a device for removing an IC from a container in accordance with one aspect of the present invention.
Figure 3D:
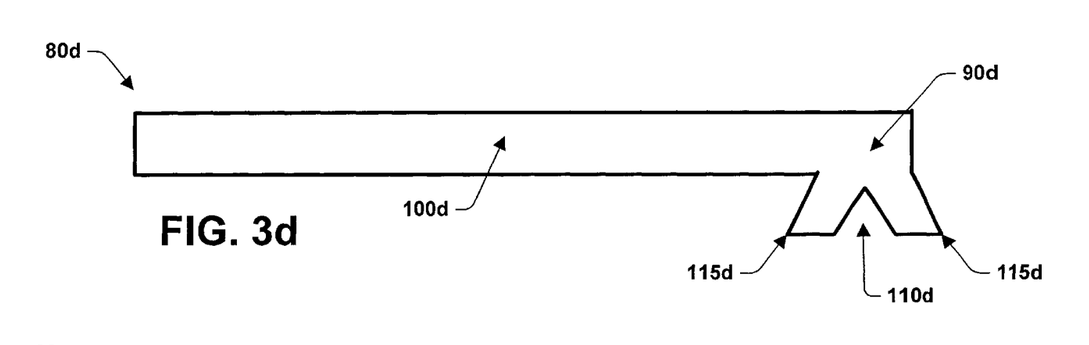
FIG. 3d is a schematic illustration of a device for removing an IC from a container in accordance with one aspect of the present invention.
Figures 3E, 3F:
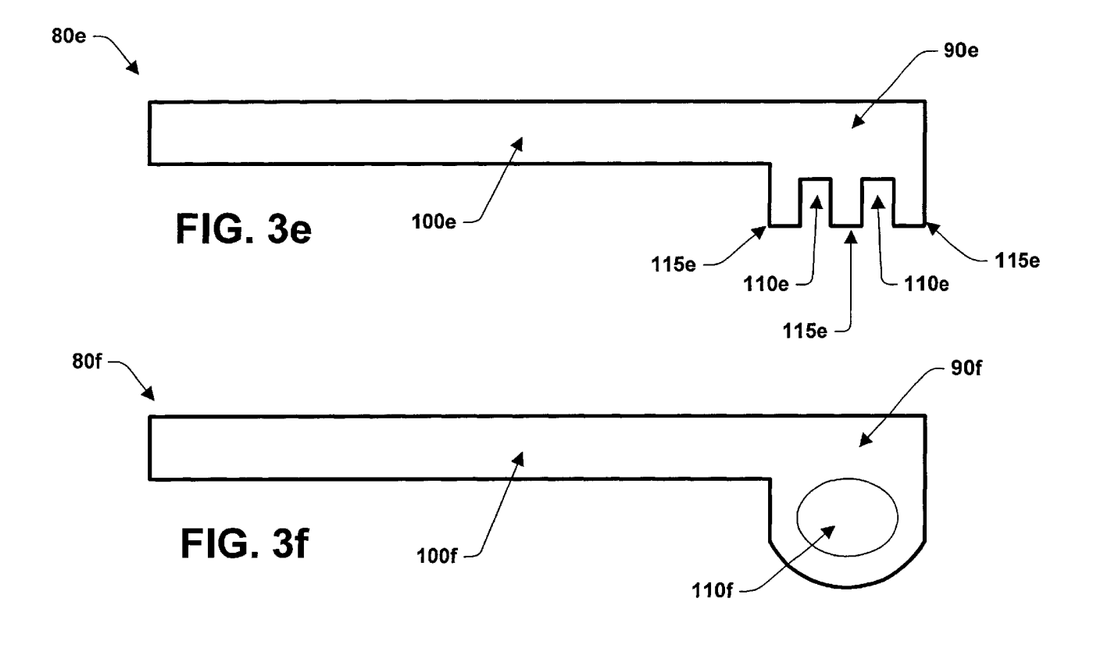
FIG. 3e is a schematic illustration of a device for removing an IC from a container in accordance with one aspect of the present invention.
FIG. 3f is a schematic illustration of a device for removing an IC from a container in accordance with one aspect of the present invention.

In accordance with one aspect of the present invention, FIG. 3a illustrates a plan view of a device 80 for releasing a retaining pin from an IC container. Although the present invention is disclosed in conjunction with a traditional retaining pin and IC container, the present invention is applicable to various types of pins and container configuration and such variations are contemplated as falling within the scope of the present invention. The device 80 includes a gripping portion 90, a handle portion 100, and one or more notches 110. The device 80 may include teeth 115 that form a notch 110. The handle portion 100 may be oblong in shape, and of any length suitable to provide sufficient leverage to remove an IC storage tube retaining pin from its respective tube. The handle portion 100a may be generally straight along its length as shown, or alternatively may be oblong, tapered, rounded, or have various bends (not shown) at various lengths along its length, for instance about ⅔'s along the length of the handle 100a, as will be shown and discussed in greater detail below. As illustrated in FIGS. 3a–c, the teeth 115a, 115b, and 115c may be generally rectangular in shape, positioned generally perpendicular to the handle portion 100a, 100b and 100c, and positioned generally parallel to each other forming a notch 110a, 110b and 110c, respectively. In another aspect of the present invention, as shown in FIG. 3d, the teeth 115d may be positioned obliquely in relation to each other, and the teeth 115d may be positioned obliquely in relation to the handle 110d. As illustrated in FIG. 3b, the notch 110b may be substantially U-shaped, or as shown in FIG. 3c, the notch 110c may be substantially V-shaped. The gripping portion 90e may include a plurality of notches 110e and a plurality of teeth 115e as illustrated by FIG. 3e. In yet another aspect of the present invention, as shown in FIG. 3f, the gripping portion 90f may not have any teeth, and form a notch 110f that is substantially circular or elliptical.

It is to be appreciated that the teeth and the notches of the present invention may be any size or shape suitable for gripping or otherwise engaging a pin. It is also to be appreciated that the teeth may be positioned in any relation to one another to form a notch suitable for engaging the pin. The teeth also may be positioned in relation to the handle in any manner that is suitable to allow the handle to serve as a lever. The handle may be any shape and size suitable for gripping by a user or an actuation mechanism. The devices of the present invention may be of any size suitable for releasing a retaining pin from an IC storage tube, for instance having a length of about 13 cm. The devices of the present invention may be made from any material of sufficient strength to remove a pin from an IC storage container, for instance stainless steel or plastic. The IC tubes of the present invention include those used to store, for example, SOIC 44 integrated circuits.

Figures 4A, 4B:
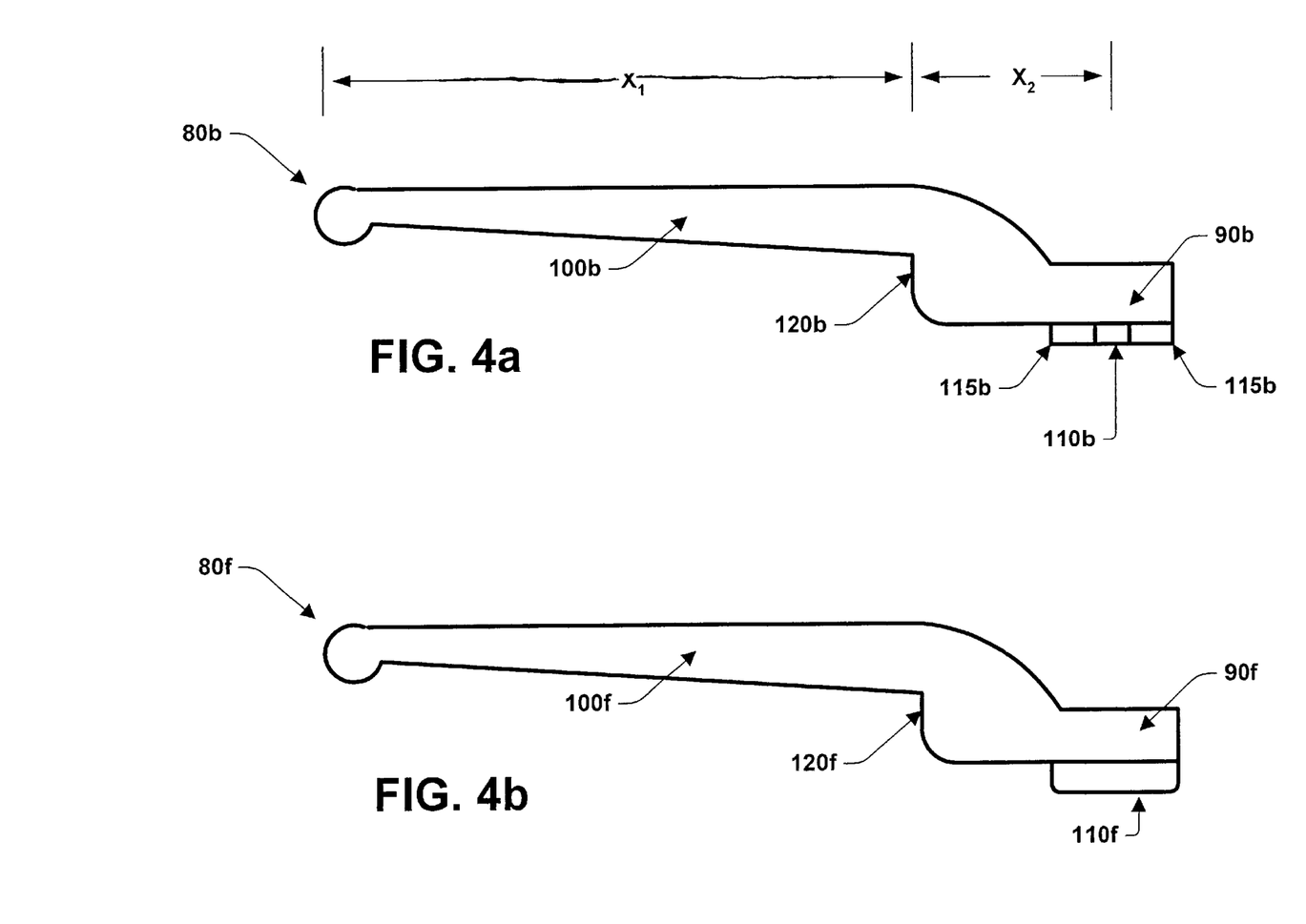
FIG. 4a is a schematic illustration of a device for removing an IC from a container in accordance with one aspect of the present invention.
FIG. 4b is a schematic illustration of a device for removing an IC from a container in accordance with one aspect of the present invention.

Turning now to FIG. 4a, an exemplary side view of the device 80b of FIG. 3b is shown. The device 80b includes the gripping portion 90b, the handle portion 100b, and the notch 110b. The handle portion 100b includes a bent portion 120b about which a pivot point or mechanical moment is established. The handle portion 100b may be oblong in shape, tapered, straight, or rounded, and of any length suitable to provide leverage to remove an IC storage tube retaining pin. The bent portion 120b may be at various lengths along the handle 100b, for instance about ⅔'s along the length of the handle 100b. The bend 120b can be at any length suitable for providing leverage when force is applied to the handle. As may be appreciated, a ratio of the sublengths ($X_1/X_2$) as defined by the location of the bend 120b aids in determining the mechanical advantage or leverage provided by the device 80b in removing the pin. The bend 120b in the handle may be about 90 degrees as shown, or may be larger or smaller, as may be desired. The angle of the bend 120b can be any angle suitable for providing leverage when force is applied to the handle. The device 80b may also include teeth 115b that form the notch 110b. In another aspect of the present invention, the device 80f does not have teeth, and the notch 100f is substantially circular or elliptical as illustrated in FIGS. 3f and 4b.

It is to be appreciated that the teeth and/or the notches of the present invention may be any size and shape suitable for gripping a pin. It is also to be appreciated that the teeth may be positioned in any relation to one another to form a notch suitable for engaging a pin. The teeth may be positioned in any relation to the handle that is suitable to allow the handle to serve as a lever. The handle may be any shape and size suitable for gripping by a user or an actuation mechanism. The notches may be any size and shape suitable for substantially accommodating an integrated circuit tube pin. The devices of the present invention may be of any size or length suitable for releasing a retaining pin from an IC storage tube, for instance about 13 cm. The devices of the present invention may be made from any material of sufficient strength to remove a pin from an IC storage container, for instance stainless steel or plastic. The IC tubes of the present invention include those used to store, for example, SOIC 44 integrated circuits.

Figure 5:
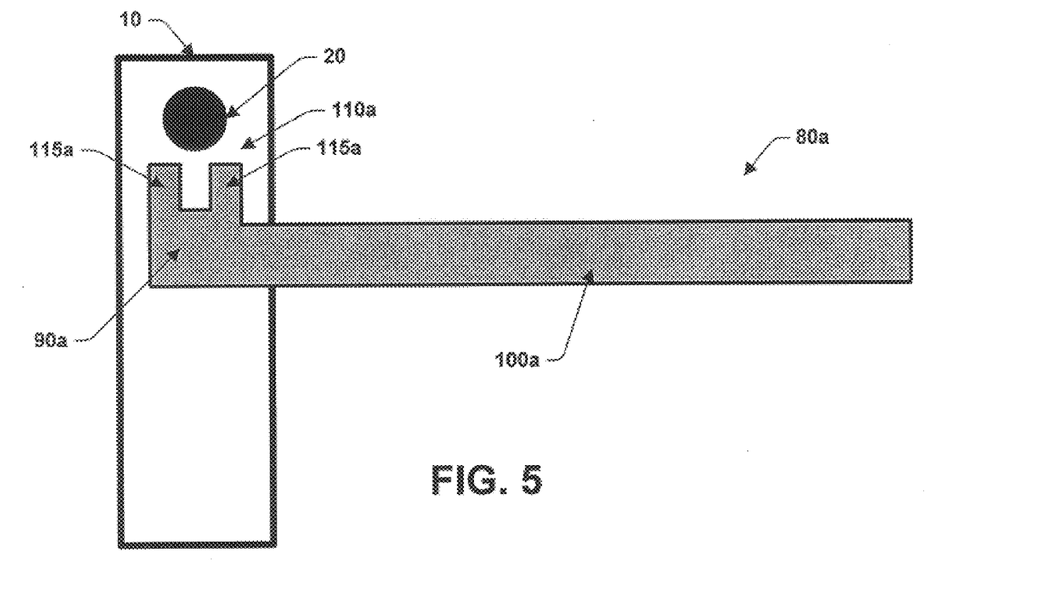
FIG. 5 is a schematic illustration of a device for releasing an IC from a container and an IC container in accordance with one aspect of the present invention.
Figure 6:
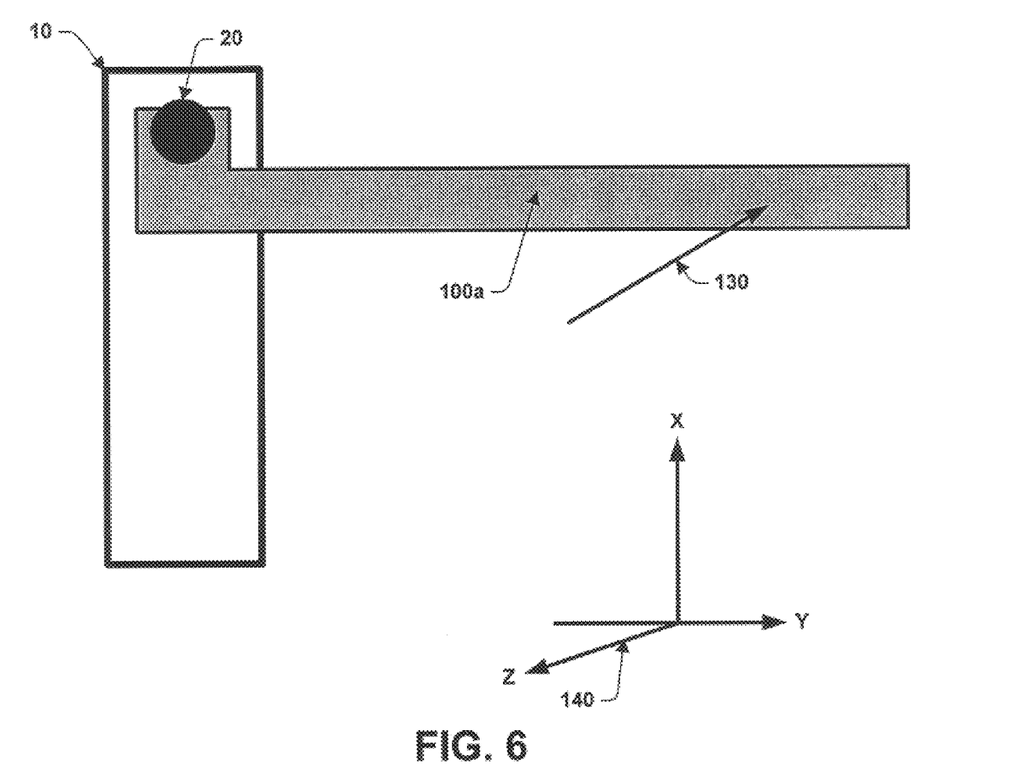
FIG. 6 is a schematic illustration of a device for releasing an IC from a container and an IC container in accordance with one aspect of the present invention.

In FIG. 5, a device, for example 80a, for releasing an IC from a container is illustrated. In one aspect of the present invention, the device 80a is used to remove a retaining pin 20 from an IC storage tube 10 to release the IC (not shown). In this aspect, the device 80a may be used to engage the retaining pin 20, for instance by placing the gripping portion 90a under the cap of the pin 20 so that the notch 110a accommodates the shaft (not shown) of the pin. As shown in FIG. 6, once the notch 110a engages the pin 20, a force 130 is applied to the handle 100a, for example, in the −Z direction, which in turn causes the device 80a to pivot about its moment point, thus causing the notch 110a to lift up generally in the +Z direction, which removes the pin 20 from the tube 10.

Figure 7:
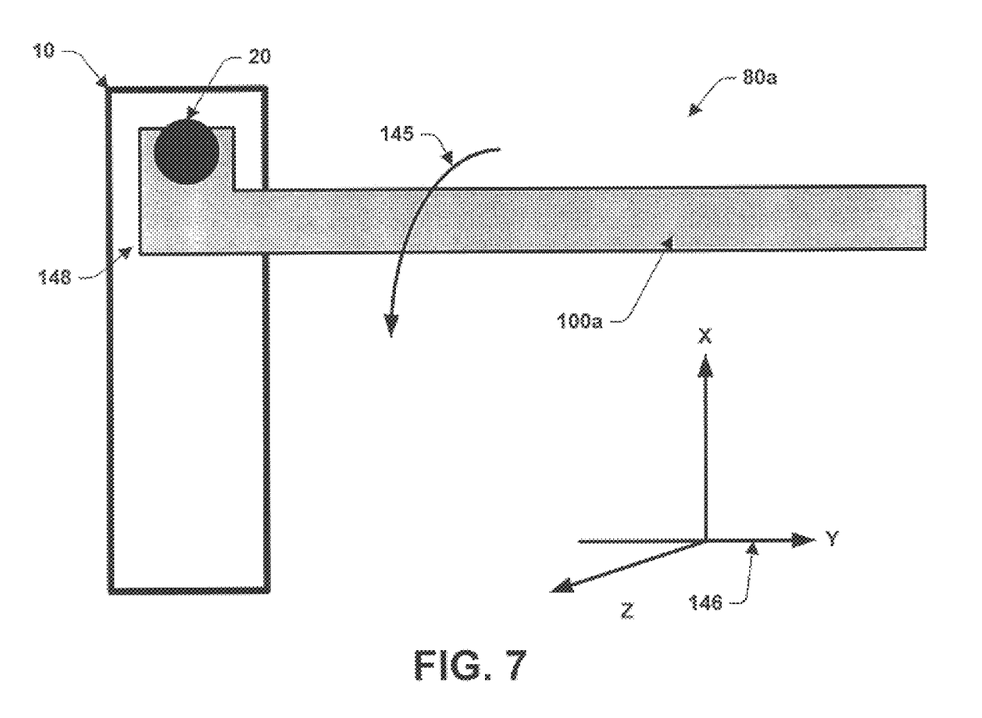
FIG. 7 is a schematic illustration of a device for releasing an IC from a container and an IC container in accordance with one aspect of the present invention.

Alternatively, as shown in FIG. 7, the device 80a may be twisted in order to remove the pin 20. In this aspect of the present invention, for example, a force 145 is applied to the handle portion 100a in a twisting motion about the Y-axis 146 (in the X-Z plane), which in turn causes the notch 110a to pivot about a different pivot point 148 and lifts the notch up generally in the +Z direction and removes the pin 20 from the container 10. The twisting motion may be in the X-Z plane and toward the container 10 as shown in FIG. 7, or the twisting motion may be in the X-Z plane and away from the container 10 (not shown). It is to be appreciated that the force, or pressure, may be applied in any direction that will cause the pin to be extricated from the tube.

Figure 8:
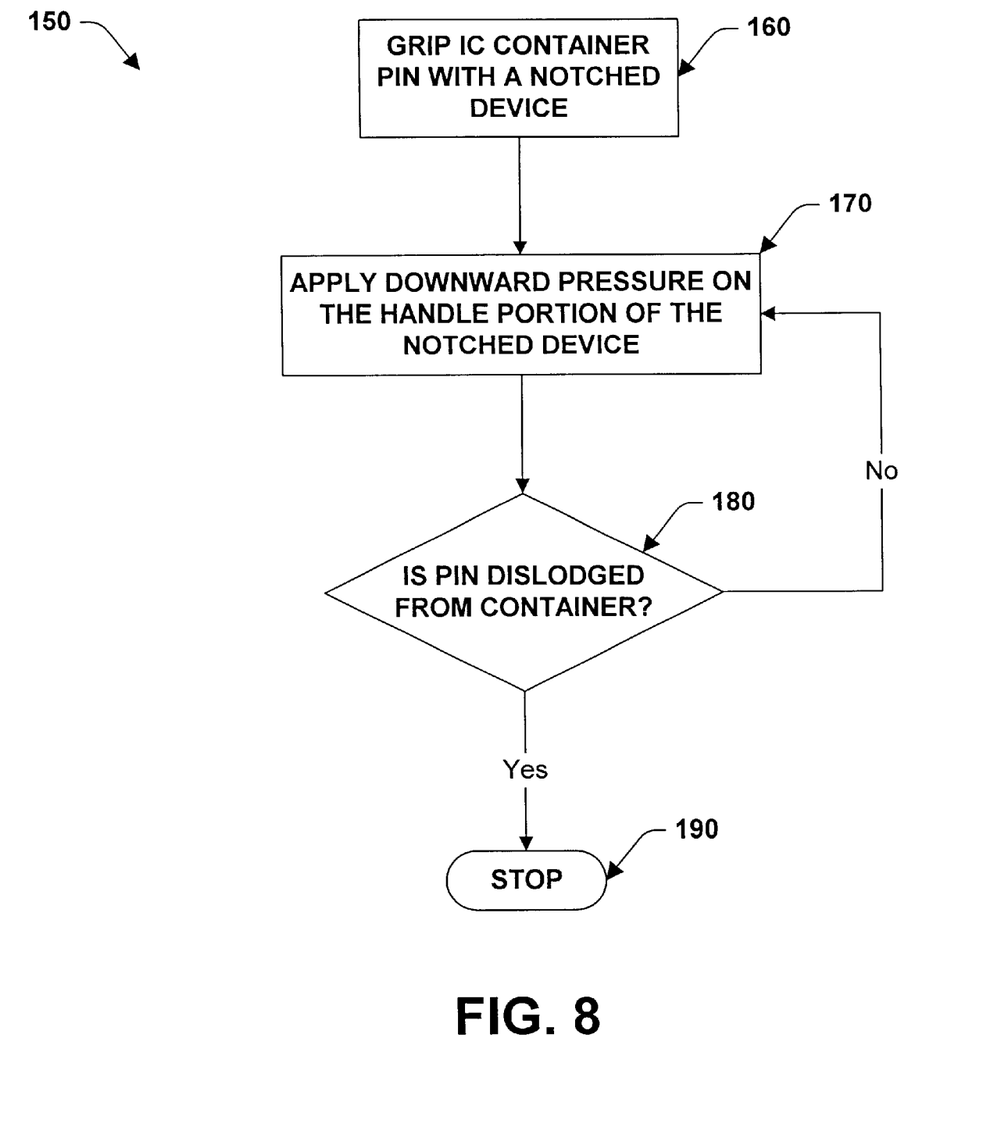
FIG. 8 illustrates a flow chart for a method of releasing an IC from a container in accordance with one aspect of the present invention.

Turning now to FIG. 8, a flowchart illustrates a method 150 for releasing an IC from a container. The method 150 begins at step 160 in which an IC container pin is gripped with a notched device. In step 170, downward force is applied to the handle of the notched device. At step 180, if the pin is not dislodged from the container (NO), the method returns to step 170 and more downward force is applied to the handle. If at step 180, the pin is dislodged from the container (YES), the method terminates at step 190.

Figure 9:
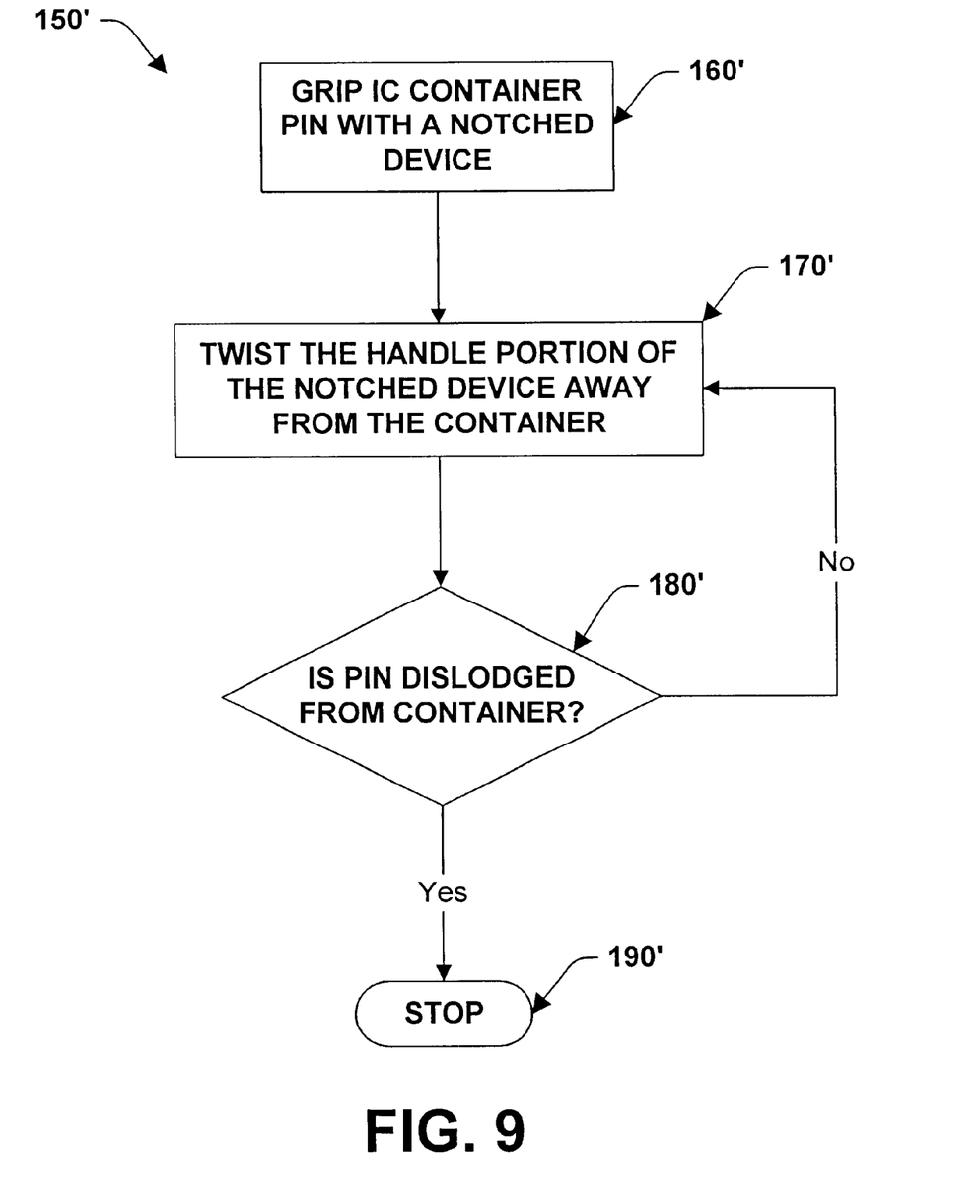
FIG. 9 illustrates a flow chart for a method of releasing an IC from a container in accordance with one aspect of the present invention.

FIG. 9 illustrates a flowchart for a method 150' for releasing an IC from a container. The method 150' begins at step 160' in which an IC container pin is gripped with a notched device. In step 170', the handle portion of the notched device is twisted away from the container. At step 180', if the pin is not dislodged from the container (NO), the method returns to step 170' and the handle is twisted more. If at step 180', the pin is dislodged from the container (YES), the method terminates at step 190'.

The notched devices for use in the present invention include a device that includes a gripping portion, a handle portion, and one or more notches. The device may have teeth that form a notch. The handle portion may be oblong in shape, and of any length suitable to provide leverage to remove an IC storage tube retaining pin. The handle may be straight, oblong, tapered, rounded, or have various bends at various lengths along the handle, for instance about ⅔'s along the length of the handle. The bend can be at any length suitable for providing leverage when force is applied to the handle. The bends in the handle may be 90 degrees, or may be larger or smaller. The angle of the bend can be any angle suitable for providing leverage when force is applied to the handle.

The teeth may be substantially rectangular in shape, positioned substantially perpendicular to the handle, and positioned substantially parallel to each other forming a notch. In another aspect of the present invention, the teeth may be positioned obliquely in relation to each other, and the teeth may be positioned obliquely in relation to the handle. The notch may be substantially U-shaped or may be substantially V-shaped. The gripping portion may include a plurality of notches and a plurality of teeth. In yet another aspect of the present invention, the gripping portion may not have any teeth, and form a notch that is substantially circular or elliptical.

The teeth and the notches of the present invention may be any size and shape suitable for gripping a pin. The teeth may be positioned in any relation to one another to form a notch suitable for engaging a pin. The teeth may be positioned in any relation to the handle that is suitable to allow the handle to serve as a lever. The handle may be any shape and size suitable for gripping by a user. The notches may be any shape and size suitable for substantially accommodating an integrated circuit tube pin. The devices of the present invention may be of any size suitable for releasing a retaining pin from an IC storage tube, for instance about 13 cm. The devices of the present invention may be made from any material of sufficient strength to remove a pin from an IC storage container, for instance stainless steel or plastic. The IC tubes of the present invention include those used to store SOIC 44 integrated circuits.

In yet another aspect of the present invention, the notched device may be used to release an IC from a container by engaging a retaining pin, for instance by placing the notch under the cap of the pin so that the notch accommodates the shaft of the pin. Force may be applied to the handle, which in turn removes the pin from the container. For instance the force may be a downward pressure on the handle portion of the notched device. Alternatively, the force may be a twisting force. In this aspect of the present invention, the force is applied to the handle portion of the notched device in a twisting motion in the X-Z plane, which in turn removes the pin from the container. The twisting motion may be in the X-Z plane and away from the container, or the twisting motion may be in the X-Z plane and toward the container. It is to be appreciated that the force, or pressure, may be applied in any direction that will cause the pin to be extricated from the container.

What has been described above are several aspects and embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

Although the invention has been shown and described with respect to certain embodiments, equivalent alterations and modifications will occur to others skilled in the art upon the reading and understanding of this specification and the annexed drawings. In particular regard to the various functions performed by the above described components (systems, devices, assemblies, etc.), the terms used to describe such components are intended to correspond, unless otherwise indicated, to any component which performs the specified function of the described component (i.e., that is functionally equivalent), even though not structurally equivalent to the disclosed structure that performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Furthermore, to the extent that the term "includes" is used in either the detailed description and the claims, such term is intended to be inclusive in a manner similar to the term "comprising."

I claim:

1. A method of releasing an integrated circuit from a container, comprising:

gripping an integrated circuit container pin with a notched device, the notched device comprising a handle portion and a gripping portion associated with an end of the handle portion, the handle portion having a length and a pivot point associated therewith, the gripping portion comprising at least two teeth, the at least two teeth positioned substantially perpendicular to the handle portion and spaced along at least a portion of the length of the handle portion, therein defining one or more notches for engaging a pin associated with the container, and gripping an integrated circuit container pin with a notched device, the notched device comprising a handle portion attached to a gripping portion, the handle portion having a length and a pivot point associated therewith, the gripping portion comprising at least two teeth, the at least two teeth positioned substantially perpendicular to the handle portion and spaced along at least a portion of the length of the handle portion, therein defining one or more notches for engaging a pin associated with the container, and applying downward pressure on the handle portion, wherein the downward pressure is transferred to the one or more notches by tilting the handle portion about the pivot point for removing the pin from the container.

2. The method of claim 1, wherein the handle portion of the notched device comprises a bent portion.

3. The method of claim 1, wherein the at least two teeth are positioned substantially parallel to each other, forming the one or more notches therebetween.

4. The method of claim 1, wherein the at least two teeth are positioned obliquely to each other, forming the one or more notches therebetween.

5. The method of claim 1, wherein at least one of the one or more notches is substantially U-shaped.

6. The method of claim 1, wherein at least one of the one or more notches is substantially V-shaped.

7. The method of claim 1, wherein the handle portion of the notched device comprises a rigid bar with a bend at about two-third's along its length.

8. A method of releasing an integrated circuit from a container, comprising:

gripping an integrated circuit container pin with a notched device, the notched device having a handle portion and a gripping portion associated with an end of the handle portion, the handle portion having a length and a pivot point associated therewith, the gripping portion comprising at least two teeth, the at least two teeth positioned substantially perpendicular to the handle portion and spaced along at least a portion of the length of the handle portion, therein defining one or more notches for engaging a pin associated with the container;

gripping an integrated circuit container pin with a notched device, the notched device having a handle portion and a gripping portion, the gripping portion having one or more notches for engaging a pin associated with the container, the one or more notches positioned substantially perpendicular to the handle portion, the handle portion attached to the gripping portion; and twisting the handle portion with respect to the container, wherein the twisting of the handle portion transfers a force to the one or more notches for removing the pin from the container.

9. The method of claim 8, wherein the handle portion of the notched device includes a bent portion.

10. The method of claim 8, wherein the at least two teeth positioned are substantially parallel to each other, forming the one or more notches therebetween.

11. The method of claim 8, wherein the at least two teeth are positioned obliquely to each other, forming the one or more notches therebetween.

12. The method of claim 8, wherein at least one of the one or more notches of the notched device is substantially U-shaped.

13. The method of claim 8, wherein at least one of the one or more notches of the notched device is substantially V-shaped.

14. The method of claim 8, wherein the handle portion of the notched device comprises a rigid bar with a bend at about two-third's along its length.

* * * * *